(12) United States Patent
Choi et al.

(10) Patent No.: US 9,480,179 B2
(45) Date of Patent: Oct. 25, 2016

(54) DISPLAY DEVICE, MOBILE DEVICE USING THE SAME, METHOD OF MANUFACTURING THE DISPLAY DEVICE

(71) Applicant: SAMSUNG DISPLAY CO., LTD., Yongin, Gyeonggi-Do (KR)

(72) Inventors: Byeong-Hwa Choi, Yongin (KR); Hun-Jung Lee, Yongin (KR); Sang-Ho Kim, Yongin (KR)

(73) Assignee: Samsung Display Co., Ltd., Yongin, Gyeonggi-do (KR)

( * ) Notice: Subject to any disclaimer, the term of this patent is extended or adjusted under 35 U.S.C. 154(b) by 448 days.

(21) Appl. No.: 14/072,996

(22) Filed: Nov. 6, 2013

(65) Prior Publication Data

US 2014/0285983 A1   Sep. 25, 2014

(30) Foreign Application Priority Data

Mar. 25, 2013   (KR) ........................ 10-2013-0031706

(51) Int. Cl.
| | |
|---|---|
| H05K 1/00 | (2006.01) |
| H05K 7/02 | (2006.01) |
| G06F 1/16 | (2006.01) |
| H04M 1/02 | (2006.01) |
| H04M 1/23 | (2006.01) |

(52) U.S. Cl.
CPC ............... H05K 7/02 (2013.01); G06F 1/1613 (2013.01); G06F 1/1652 (2013.01); H04M 1/0266 (2013.01); H04M 1/23 (2013.01); Y10T 29/49002 (2015.01)

(58) Field of Classification Search
CPC ............ G09G 3/20; G09G 3/34; G09G 5/00; G09F 9/30; G09F 9/37; G08B 6/00; H01L 41/09

USPC ...... 361/749, 160; 345/63, 85, 90, 173, 174, 345/204; 313/495, 581; 340/407.1, 407.2

See application file for complete search history.

(56) References Cited

U.S. PATENT DOCUMENTS

| | | | | |
|---|---|---|---|---|
| 4,392,747 | A * | 7/1983 | Kumada | G10K 13/00 368/255 |
| 5,862,275 | A * | 1/1999 | Takeuchi | G02B 26/08 310/324 |
| 6,249,370 | B1 * | 6/2001 | Takeuchi | G02B 26/02 345/85 |
| 6,265,811 | B1 * | 7/2001 | Takeuchi | H01L 41/314 310/328 |
| 6,281,868 | B1 * | 8/2001 | Takeuchi | G02B 26/0833 310/328 |
| 6,295,403 | B1 * | 9/2001 | Takeuchi | G02B 6/0043 385/128 |
| 6,453,100 | B1 * | 9/2002 | Takeuchi | G02B 26/004 345/85 |

(Continued)

FOREIGN PATENT DOCUMENTS

| | | |
|---|---|---|
| KR | 10-2011-0020048 A | 3/2011 |
| KR | 10-2012-0015764 A | 2/2012 |
| KR | 10-2012-0046585 A | 5/2012 |

*Primary Examiner* — Xiaoliang Chen
(74) *Attorney, Agent, or Firm* — Lee & Morse, P.C.

(57) ABSTRACT

A display device includes a display panel, an actuator unit including a plurality of actuator members generating vibrations and disposed to face one side of the display panel, and a support unit contacting the actuator unit to receive a vibration generating from the actuator unit and including a plurality of support members disposed to respectively correspond to the plurality of actuator members and spaced apart from each other.

34 Claims, 12 Drawing Sheets

(56) References Cited

U.S. PATENT DOCUMENTS

| | | | | |
|---|---|---|---|---|
| 6,483,492 B1* | 11/2002 | Takeuchi | ............... | G02B 26/02 345/63 |
| 6,690,344 B1* | 2/2004 | Takeuchi | ............. | G09G 3/3473 345/204 |
| 6,724,973 B1* | 4/2004 | Takeuchi | ............... | G02B 26/02 385/147 |
| 6,922,274 B2* | 7/2005 | Takeuchi | ............... | G02B 26/08 345/108 |
| 2002/0080129 A1* | 6/2002 | Takeuchi | ............... | G09F 9/305 345/204 |
| 2002/0140348 A1* | 10/2002 | Takeuchi | ................ | G09F 9/372 313/581 |
| 2003/0025442 A1* | 2/2003 | Takeuchi | ................ | G02B 26/004 313/495 |
| 2003/0053281 A1* | 3/2003 | Takeuchi | ............... | G02B 26/02 361/160 |
| 2003/0222862 A1* | 12/2003 | Takeuchi | ............. | G09G 3/3466 345/204 |
| 2003/0227447 A1* | 12/2003 | Takeuchi | ................ | G09G 3/3473 345/204 |
| 2003/0227449 A1* | 12/2003 | Takeuchi | ............. | G09G 3/3466 345/204 |
| 2003/0231156 A1* | 12/2003 | Takeuchi | ............. | G09G 3/3473 345/98 |
| 2006/0046031 A1* | 3/2006 | Janevski | ................ | G06F 3/016 428/195.1 |
| 2008/0080126 A1* | 4/2008 | Huang | ................... | F16M 11/10 361/679.06 |
| 2008/0122315 A1* | 5/2008 | Maruyama | ............... | G06F 3/016 310/314 |
| 2010/0067726 A1* | 3/2010 | Suzuki | ................... | G06F 1/1605 381/333 |
| 2010/0182263 A1* | 7/2010 | Aunio | ..................... | G06F 3/016 345/173 |
| 2011/0043477 A1* | 2/2011 | Park | ......................... | G06F 3/016 345/174 |
| 2011/0084916 A1* | 4/2011 | Park | ........................ | G06F 3/016 345/173 |
| 2011/0084917 A1* | 4/2011 | Son | ........................ | G06F 1/1626 345/173 |
| 2011/0127884 A1* | 6/2011 | Woo | ...................... | B06B 1/0622 310/328 |
| 2011/0216027 A1* | 9/2011 | Kim | ......................... | G08B 6/00 345/173 |
| 2011/0260843 A1* | 10/2011 | Woo | ....................... | G06F 3/016 340/407.2 |
| 2011/0260995 A1* | 10/2011 | Woo | ........................ | G06F 3/016 345/173 |
| 2011/0304581 A1* | 12/2011 | An | .......................... | G06F 3/016 345/174 |
| 2012/0038470 A1* | 2/2012 | Kim | .................... | H04N 1/00411 340/407.2 |
| 2012/0038471 A1* | 2/2012 | Kim | .................... | H04N 1/00411 340/407.2 |
| 2012/0075522 A1* | 3/2012 | Misawa | .................. | G03B 17/02 348/373 |
| 2012/0092272 A1 | 4/2012 | Miles et al. | | |
| 2012/0139850 A1* | 6/2012 | Kim | ........................ | G06F 3/016 345/173 |
| 2012/0139851 A1* | 6/2012 | Kim | ........................ | G06F 3/016 345/173 |
| 2013/0307789 A1* | 11/2013 | Karamath | ............... | G06F 3/016 345/173 |

* cited by examiner

FIG. 11
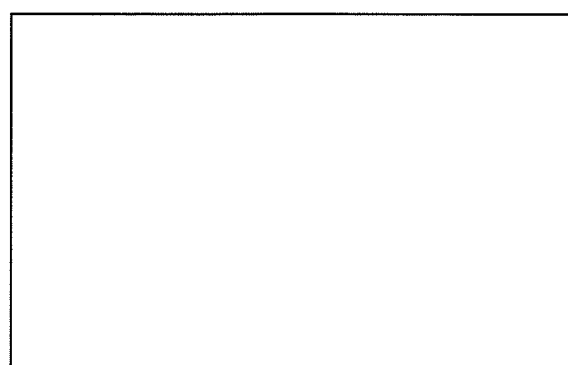
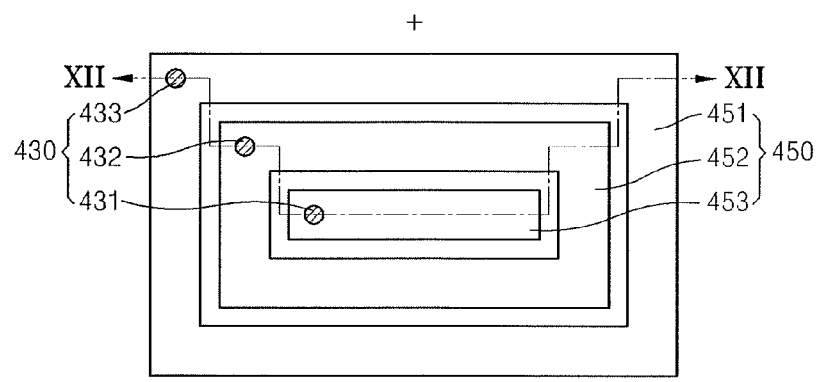
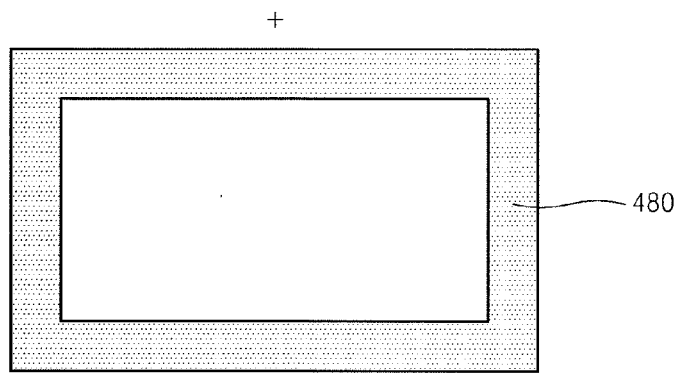
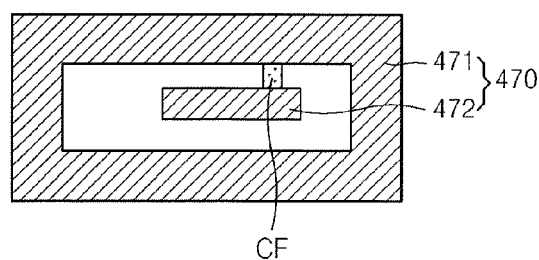

FIG. 14
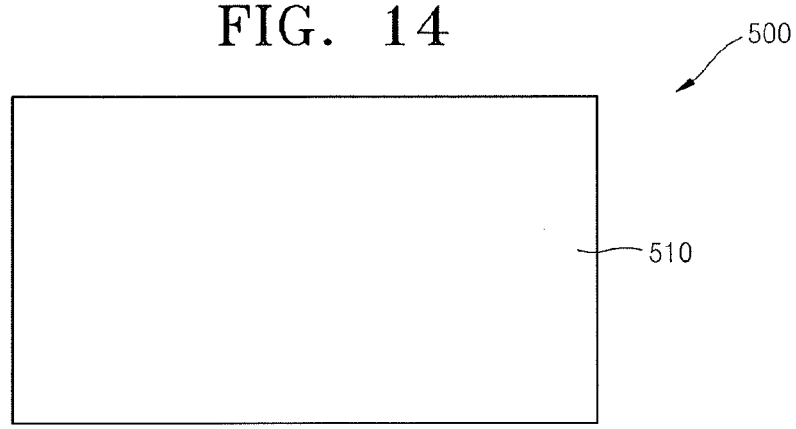
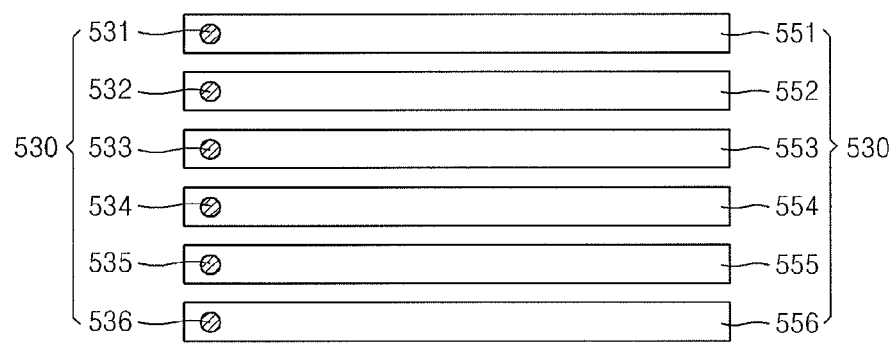
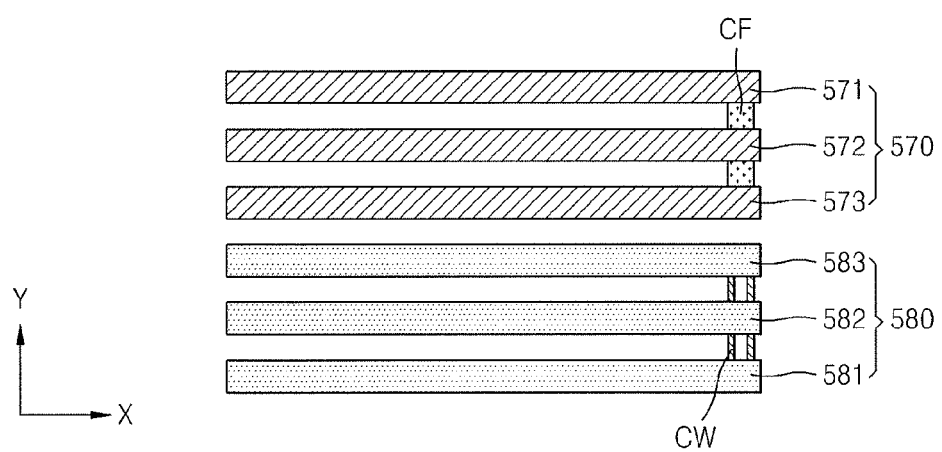

DISPLAY DEVICE, MOBILE DEVICE USING THE SAME, METHOD OF MANUFACTURING THE DISPLAY DEVICE

CROSS-REFERENCE TO RELATED PATENT APPLICATION

This application claims the benefit of Korean Patent Application No. 10-2013-0031706, filed on Mar. 25, 2013, in the Korean Intellectual Property Office, the disclosure of which is incorporated herein in its entirety by reference.

BACKGROUND

1. Field

Embodiments relate to a display device, a mobile device using the same, and a method of manufacturing the display device.

2. Description of the Related Art

The applications of display devices have been diversified in recent years. Especially, as the thicknesses of the display devices become thinner and their weights become lighter, the scopes of their usages have become wider. For example, such display devices are extensively applied to mobile devices such as mobile phones and tablet PCs.

SUMMARY

Embodiments are directed to a display device including a display panel, an actuator unit including a plurality of actuator members generating vibrations and disposed to face one side of the display panel, and a support unit contacting the actuator unit to receive a vibration generated from the actuator unit, the support unit including a plurality of support members disposed to respectively correspond to the plurality of actuator members and spaced apart from each other.

The display device may further include a circuit unit formed to correspond to the support unit.

The circuit unit may include a plurality of circuit members corresponding to the plurality of support members and disposed spaced apart from each other.

The plurality of circuit members may be electrically connected to each other by a circuit connection member.

The circuit connection member may have a flexible printed circuit (FPC) form.

The plurality of circuit members may be disposed in one direction, and each of the plurality of circuit members may include a plurality of split members spaced apart from each other, disposed in a direction intersecting the one direction, and connected to each other by a circuit connection member.

The circuit unit may have a printed circuit board form.

The circuit unit may be disposed to contact an opposite side of a side facing the display panel among sides of the support unit.

The display device may further include a battery unit formed to correspond to the support unit.

The battery unit may include a plurality of battery members corresponding to the plurality of support members and spaced apart from each other.

The plurality of battery members may be electrically connected to each other by a battery connection member.

The battery connection member may have a conductive wire form.

The plurality of battery members may be disposed in one direction, and each of the plurality of battery members may include a plurality of split members spaced apart from each other, disposed in a direction intersecting the one direction, and connected to each other by a battery connection member.

The battery unit may be disposed to contact an opposite side of a side facing the display panel among sides of the support unit.

The display device may further include a circuit unit and a battery unit, which are formed to correspond to the support unit and spaced apart from each other.

The circuit unit and the battery unit may be disposed not to overlap each other on the basis of a thickness direction of the display panel.

The plurality of support members may have a form elongated in parallel with a horizontal or vertical direction of the display panel.

The plurality of support members may have a length corresponding to a width in one direction of the display panel.

The support unit may be disposed to contact one side of the display panel.

The actuator unit may be disposed to contact one side of the display panel.

The actuator unit may include a plurality of actuator members disposed in one direction or a direction intersecting the one direction.

The support member may include a plurality of support members disposed in the one direction or the direction intersecting the one direction.

The plurality of support members of the support unit may include one support member formed to correspond to a middle of the display panel and a support member disposed to surround the one support member.

The display device may further include a circuit unit and a battery unit, which are formed to correspond to the support unit and disposed spaced apart from each other.

The display device may further include a back cover facing the display panel and disposed farther from the display panel than the support unit and the actuator unit.

The back cover may be formed of a vibration transmission blocking material.

The back cover may contain rubber.

The display panel may include a substrate, a first electrode and a second electrode formed on the substrate, and an interlayer disposed between the first electrode and the second electrode, the interlayer including an organic light emitting layer.

The substrate may have flexibility.

The plurality of actuator members may be separately controlled.

The display device may further include a touch panel disposed adjacent to the display panel.

The display panel may include a touch recognition member thereon or therein to recognize a user touch.

Embodiments are also directed to a mobile device having a display device, the display device including a display panel, an actuator unit including a plurality of actuator members disposed to face one side of the display panel and generating vibrations, and a support unit contacting the actuator unit to receive a vibration generated from the actuator unit, the support unit including a plurality of support members disposed to respectively correspond to the plurality of actuator members and spaced apart from each other.

The mobile device may be a mobile phone or a tablet PC.

Embodiments are also directed to a method of manufacturing a display device, the method including preparing a display panel, arranging an actuator unit disposed to face one side of the display panel and including a plurality of actuator members generating vibrations, and arranging a support unit contacting the actuator unit to receive a vibration generated from the actuator unit, the support unit including a plurality of support members disposed to respectively correspond to the plurality of actuator members and spaced apart from each other.

BRIEF DESCRIPTION OF THE DRAWINGS

Features will become apparent to those of skill in the art by describing in detail example embodiments with reference to the attached drawings in which:

FIG. 11 is a plan view illustrating a display device according to another example embodiment;

FIG. 14 is a plan view of FIG. 13 as seen from a direction A.

DETAILED DESCRIPTION

Figure 1:
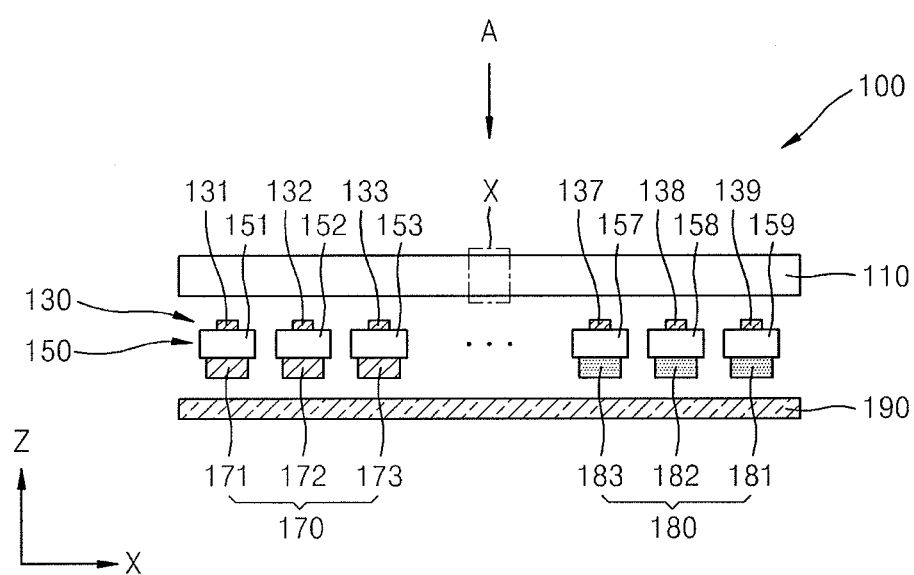
FIG. 1 is a cross-sectional view illustrating a display device according to an example embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey example implementations to those skilled in the art. In the drawing figures, the dimensions of layers and regions may be exaggerated for clarity of illustration. Like reference numerals refer to like elements throughout.

Figure 2:
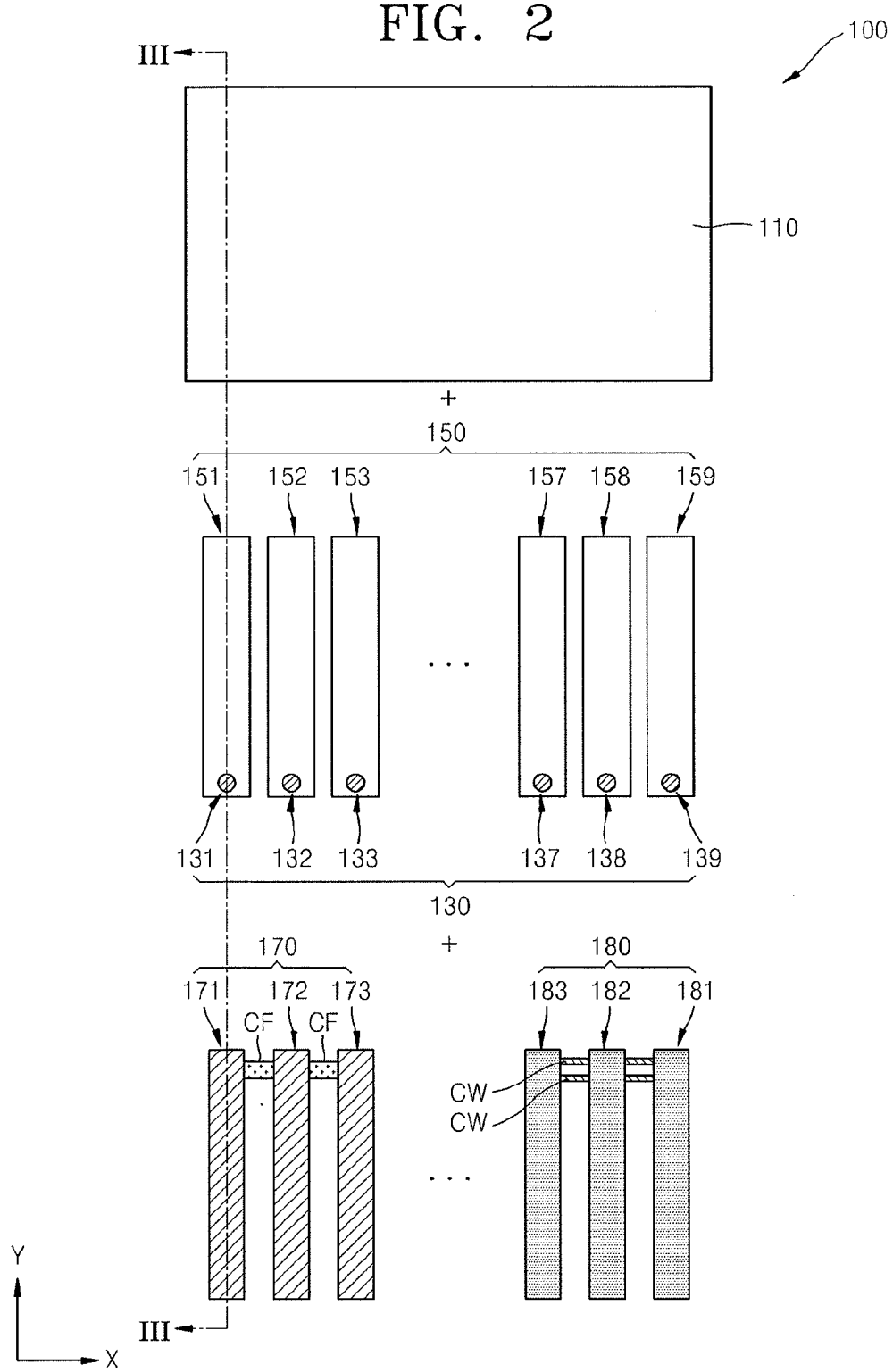
FIG. 2 is a plan view of FIG. 1 as seen from a direction A.
Figure 3:
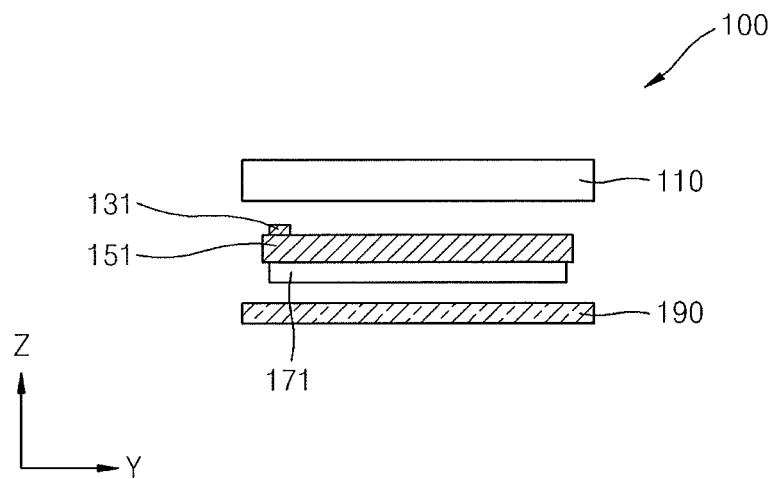
FIG. 3 is a cross-sectional view taken along the line III-III of FIG. 2.

FIG. 1 is a cross-sectional view of a display device according to an example embodiment. FIG. 2 is a plan view of FIG. 1 as seen from a direction A. FIG. 3 is a cross-sectional view taken along the line III-III of FIG. 2.

In the example embodiment shown in FIGS. 1 to 3, a display device 100 includes a display panel 110, an actuator unit 130, a support unit 150, a circuit unit 170, a battery unit 180, and a back cover 190.

For convenience of description, as shown in FIG. 2, the display panel 110, the actuator unit 130, the support unit 150, the circuit unit 170, and the battery unit 180 are shown on one plane.

The display panel 110 may include various kinds of a display device in order to implement an image that a user recognizes. For example, the display panel 110 may include a display device in an organic light emitting device form including an organic light emitting layer. A specific configuration of the display panel 110 will be described below with reference to FIGS. 4A to 4C.

The actuator unit 130 is disposed to face one side of the display panel 110. In more detail, the actuator unit 130 faces the bottom of the display panel 110 as shown in FIG. 1. In this case, the display panel 110 may implement an image through the top.

The actuator unit 130 includes a plurality of actuator members 131 to 139. The number of the actuator members 131 to 139 may vary according to a size and type of the display device 100.

The actuator members 131 to 139 generate vibrations and deliver them to the display panel 110. For this, the actuator members 131 to 139 may have, e.g., a vibration motor form.

The actuator members 131 to 139 are uniformly distributed in the entire area of the display panel 110 if possible. For example, as shown in FIGS. 1 and 2, the actuator members 131 to 139 are disposed at predetermined intervals in a horizontal direction (an X-axis direction of FIGS. 1 and 2).

Thus, the actuator unit 130 may be disposed to allow only each one of the actuator members 131 and 139 to correspond to each horizontal direction of the display panel 110.

The actuator members 131 to 139 are spaced apart from each other. This helps prevent the vibration of one of the plurality of actuator members 131 to 139 from affecting another actuator member. Thus, each of the actuator members 131 to 139 vibrates independently and delivers the vibration to the display panel 110.

The support unit 150 is formed to support the actuator unit 130. The support unit 150 is disposed to face one side of the display panel 110, i.e., the bottom.

The support unit 150 includes a plurality of support members 151 to 159. The support members 151 to 159 are formed to respectively correspond to the actuator members 131 to 139. In more detail, the support members 151 to 159 respectively contact the actuator members 131 to 139. As shown in FIG. 1, the actuator members 131 to 139 are formed on the tops of the support members 151 to 159, respectively. In this case, the actuator unit 130 contacts the display panel 110. However, the present example embodiment is not limited thereto. For example, grooves (not shown) having a predetermined depth may be formed in the tops of the support members 151 to 159, and the actuator members 131 to 139 may be disposed in the grooves to allow the display panel 110 to contact the support unit 150. In addition, the actuator members 131 to 139 may be disposed in the support members 151 to 159 to allow the display panel 110 to contact the support unit 150.

The support members 151 to 159 are formed to contact the actuator members 131 to 139 so that they receive vibrations occurring from the actuator members 131 to 139. At this point, the support members 151 to 159 are spaced apart from each other in order to help prevent the vibration delivered to one of the support members 151 to 159 from being spread into at least one of the remaining support members.

Through this, the support members 151 to 159 vibrate respectively by the actuator members 131 to 139 corresponding thereto.

The plurality of support members 151 to 159 are uniformly distributed in the entire area of the display panel 110, if possible. For example, as shown in FIG. 2, each of the support members 151 to 159 may be disposed at a predetermined interval in the horizontal direction (the X-axis direction of FIG. 2) of the display panel 110.

Thus, the support unit 150 may be disposed to allow only each one of the support members 151 and 159 to correspond to a horizontal direction of the display panel 110. Additionally, each of the support members 151 to 159 is formed to have an elongated form. Thus, each of the support members 151 to 159 elongates in a direction intersecting the arrangement direction thereof, i.e., a vertical direction of the display panel 110. For example, each of the support members 151 to 159 may have a length corresponding to the vertical length (length along the Y axis) of the display panel 110.

The circuit unit 170 and the battery unit 180 are disposed to face the support unit 150. Thus, the circuit unit 170 and the battery unit 180 may be disposed not to overlap each other and to face the support unit 150. Moreover, the circuit unit 170 and the battery unit 180 may be disposed to contact one side of the support unit 150.

The circuit unit 170 includes a plurality of circuit members 171 to 173. The number of the circuit members 171 to 173 may vary according to a size and type of the display device 100.

The circuit unit 170 may include various members generating and delivering various electrical signals necessary for driving the display panel 110. For this, the plurality of circuit members 171 to 173 may have a form of a printed circuit board (PCB). Additionally, according to an example embodiment, the circuit unit 170 may generate and deliver an electrical signal for controlling the actuator unit 130.

The circuit members 171 to 173 are spaced apart from each other. A circuit connection member CF is disposed to deliver an electrical signal between the circuit members 171 to 173 spaced apart from each other. The circuit connection member CF may be flexible, and may include a form of a flexible printed circuit (FPC), for example.

The circuit members 171 to 173 are disposed to respectively correspond to the support members 151 to 153. Additionally, for efficiency, durability, and thickness reduction aspects of the assembly of the display device 100, the circuit members 171 to 173 may closely contact the support members 151 to 153, respectively.

The battery unit 180 includes a plurality of battery members 181 to 183. The number of the battery members 181 to 183 may vary according to a size and type of the display device 100.

The battery unit 180 supplies a power for driving the display panel 110 or the actuator unit 130. The battery members 181 to 183 are spaced apart from each other. A battery connection member CW is disposed for electrical connection between the battery members 181 to 183 spaced apart from each other. The battery connection member CW may have a conductive wire form.

Additionally, the battery unit 180 may be spaced apart from the circuit unit 170.

The battery members 181 to 183 are disposed to respectively correspond to the support members 157 to 159. Additionally, for efficiency, durability, and thickness reduction aspects of the assembly of the display device 100, the battery members 181 to 183 may closely contact the support members 157 to 159, respectively.

The back cover 190 may be disposed to face the display panel 110. The back cover 190 is disposed farther away from the display panel 110, compared to the actuator unit 130, the support unit 150, the circuit unit 170, and the battery unit 180. The back cover 190 protects the actuator unit 130, the support unit 150, the circuit unit 170, and the battery unit 180, and when the display device 100 is implemented for a mobile device, it may maintain its external appearance and provide easy connection for other members.

The back cover 190 may be disposed to contact the circuit unit 170 or the battery unit 180.

Moreover, the back cover 190 may be formed of a material for preventing vibration transmission, for example, a rubber material. Through this, the vibration occurring from the actuator unit 130 independently generating vibration may be prevented from being spread and delivered to an entire surface of the back cover 190.

Figure 4A:
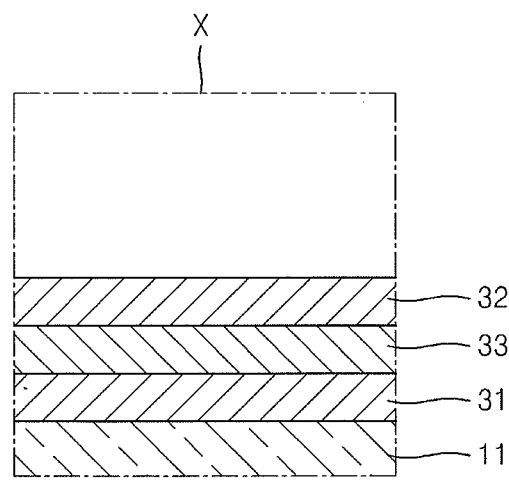
FIG. 4A is an enlarged view of a region X of FIG. 1.

FIG. 4A is an enlarged view of a region X of FIG. 1. The display panel 110 will be described in more detail with reference to FIG. 4A.

The display panel 110 includes a substrate 11, a first electrode 31, a second electrode 32, and an interlayer 33.

The substrate 11 may be formed of various materials such as glass materials, plastic materials, and other metal materials.

The first electrode 31 may function as an anode and the second electrode 32 may function as a cathode. The order of polarities may be reversed.

When the first electrode 31 functions as an anode, it may include ITO, IZO, ZnO, or $In_2O_3$ having a high work function. Additionally, according to purposes and design conditions, the first electrode 31 may further include a reflective layer formed of Ag, Mg, Al, Pt, Pd, Au, Ni, Nd, Ir, Cr, Li, Yb, or Ca.

When the second electrode 32 functions as a cathode, it may be formed of a metal such as Ag, Mg, Al, Pt, Pd, Au, Ni, Nd, Ir, Cr, Li, or Ca. Additionally, the second electrode 32 may include ITO, IZO, ZnO, or $In_2O_3$ in order for light transmission.

The interlayer 33 may include an organic light emitting layer for emitting visible light. Additionally, the interlayer 33 may selectively include at least one of a hole injection layer, a hole transport layer, an electron transport layer, and an electron injection layer.

When voltage is applied to the interlayer 33 through the first electrode 31 and the second electrode 32, an organic light emitting layer in the interlayer 33 emits visible light to implement an image.

In this embodiment, although the structure in which the display panel 110 includes an organic light emitting device having an organic light emitting layer is described, the present example embodiment is not limited thereto. Thus, the display panel 110 may include various kinds of a display device.

In addition, although not shown, a touch panel (not shown) for recognizing a user touch may be disposed adjacent to the display panel 110. Moreover, in order to realize a touch function without an additional touch panel, a member for touch recognition, for example, an electrode for touch recognition (not shown), may be disposed in the display panel 110, or on the surface thereof.

Operations and effects of the display device 100 will now be described.

The display device 100 generates a vibration, which a user senses, with the actuator unit 130, to improve user convenience. For example, the display device 100 may be applied to mobile devices such as mobile phones and tablet PCs. When using a mobile device including the display device 100, a user may sense the vibration by a finger.

At this point, the actuator unit 130 includes a plurality of actuator members 131 to 139 spaced apart from each other to generate separated vibrations. Through this, vibration selectively occurs in a specific area of the display device 100 to improve user convenience. Additionally, by arranging the support members 151 to 159 spaced apart from each other to correspond to the actuator members 131 to 139, the vibration occurring from one of the actuator members 131 to 139 may be prevented from being spread into an entire area of the display device 100.

Since the circuit unit 170 contacting the support unit 150 includes the plurality of circuit members 171 to 173 spaced apart from each other and the battery unit 180 includes the plurality of battery members 181 to 183 spaced apart from each other, the vibration occurring from one of the actuator members 131 to 139 may be prevented from being spread into an entire area of the display device 100. Through this, vibration occurrence in a specific area of the display device 100 and user detection characteristic may be improved.

In the present example embodiment, the back cover 190 protects the back of the display device 100 and is formed of a material for preventing vibration transmission such as a rubber material. Thus, the vibration occurring from one of the actuator members 131 to 139 may be prevented from being spread into an entire area of the display device 100.

Additionally, when the substrate 11 of the display panel 110 is formed of a flexible material and thus the display panel 110 is a flexible display panel, the bending of the display panel 110 may be more easily controlled by separately controlling the actuator members 131 to 139. Through this, the flexible display device 100 may be manufactured and the bending of the display device 100 may be controlled, thereby improving user convenience.

Additionally, in order to generate a vibration for a predetermined time T with respect to an entire surface of the display panel 110, instead of continuously vibrating the actuator members 131 to 139 of the actuator unit 130 simultaneously for the predetermined time T, by sequentially and continuously vibrating the actuator members 131 to 139 for a much shorter time than the predetermined time T, the power consumption of the actuator unit 130 may be minimized and vibration effects may be provided.

Figure 4B:
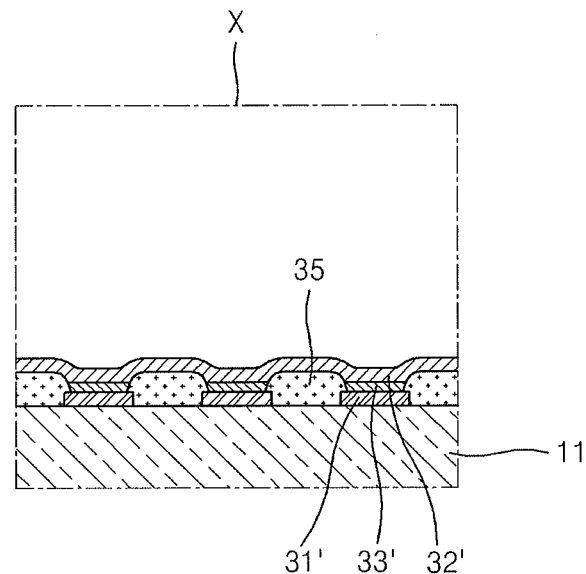
FIGS. 4B and 4C are views of modifications of FIG. 4A.
Figure 4C:
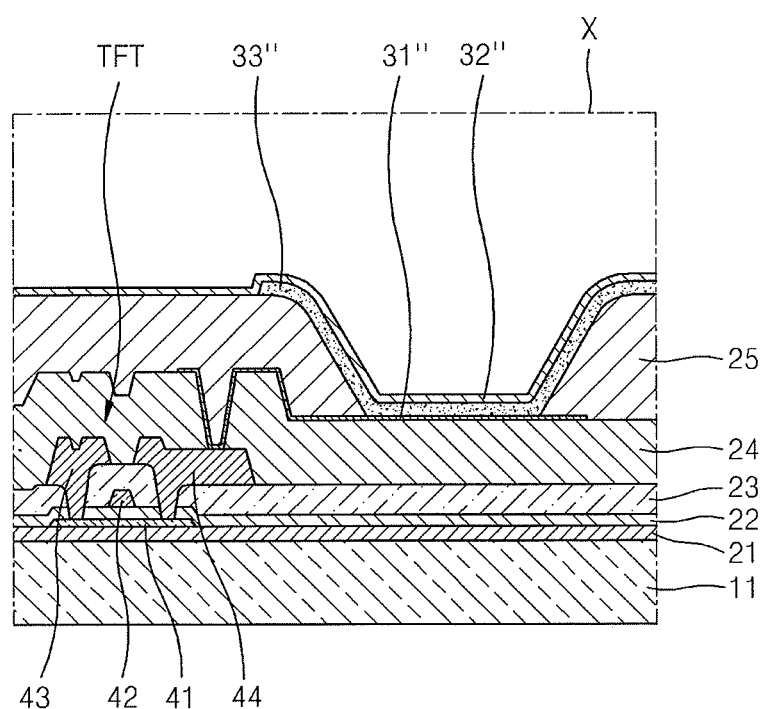

The above-mentioned display panel 110 may have various modifications. FIGS. 4B and 4C are views of the modifications of FIG. 4A.

First, referring to FIG. 4B, the display panel 110 includes a first electrode 31', an interlayer 33', and a second electrode 32'.

In more detail, the first electrode 31' is formed on the substrate 11. A pixel definition layer 35 is formed on the first electrode 31' to expose a predetermined area of the first electrode 31'. The interlayer 33' is formed on the first electrode 31' to contact the first electrode 31'.

The second electrode 32' is formed on the interlayer 33'.

The first electrode 31' may function as an anode and the second electrode 32' may function as a cathode. Of course, the order of polarities may be reversed. The interlayer 33' may include an organic light emitting layer for emitting visible light. Additionally, the interlayer 33' may selectively include at least one of a hole injection layer, a hole transport layer, an electron transport layer, and an electron injection layer.

Since materials used for forming the first electrode 31' and the second electrode 32' are the same as those described with the above embodiment, their detailed descriptions are omitted.

Additionally, as another modification of the display panel 110, referring to FIG. 4C, the display panel 110 includes a first electrode 31", an interlayer 33", a second electrode 32', and a thin film transistor TFT.

The thin film transistor TFT includes an active layer 41, a gate electrode 42, a source electrode 43, and a drain electrode 44.

They are described in more detail below.

In more detail, a buffer layer 21 is formed on a substrate 11. An active layer 41 having a predetermined pattern is formed on the buffer layer 21. The active layer 41 may be formed of a silicon based organic semiconductor, an organic semiconductor, or an oxide semiconductor, and includes a source area, a drain area, and a channel area.

A gate insulating layer 22 is formed on the active layer 41, and a gate electrode 42 is formed in a predetermined area on the gate insulating layer 22. The gate insulating layer 22 insulates the active layer 41 from the gate electrode 42 and may be formed of an organic matter or an inorganic matter such as $SiN_x$ and $SiO_2$. The gate electrode 42 may contain Au, Ag, Cu, Ni, Pt, Pd, Al, or Mo or includes an alloy such as an Al:Nd or Mo:W alloy, but is not limited thereto. Thus, the gate electrode 42 may be formed of various materials in consideration of the adhesion, smoothness, electrical resistance, and processibility of an adjacent layer.

The interlayer insulating layer 23 is formed as the top of the gate electrode 42. The interlayer insulating layer 23 and the gate insulating layer 22 are formed to expose the source are and drain area of the active layer 41, and the source electrode 43 and the drain electrode 44 are formed to contact the exposed source area and drain area of the active layer 41.

The source electrode 43 and the drain electrode 44 may be formed of various conductive materials and may have a single layer or multilayer structure.

A passivation layer 24 is formed on the thin film transistor TFT. In more detail, the passivation layer 24 is formed on the source electrode 43 and the drain electrode 44.

The passivation layer 24 does not cover the entire drain electrode 44 and is formed to expose a predetermined area thereof. The first electrode 31" is formed to be connected to the exposed drain electrode 44.

The pixel definition layer 25 formed of an insulating material is formed on the first electrode 31". The pixel definition layer 25 is formed to expose a predetermined area of the first electrode 31".

The interlayer 33" is formed to contact the exposed area of the first electrode 31". Also, the second electrode 32" is formed to be connected to the interlayer 33".

Figure 5:
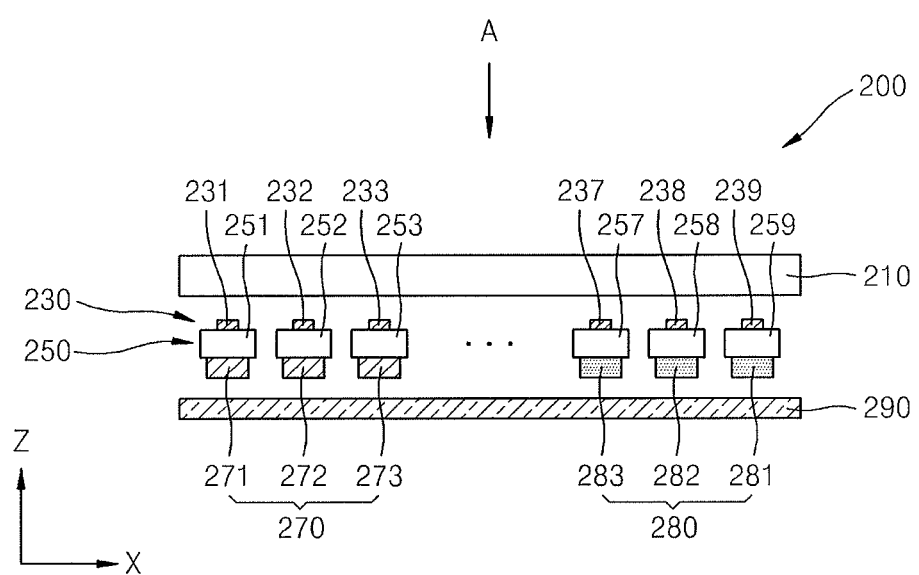
FIG. 5 is a cross-sectional view illustrating a display device according to another example embodiment.
Figure 6:
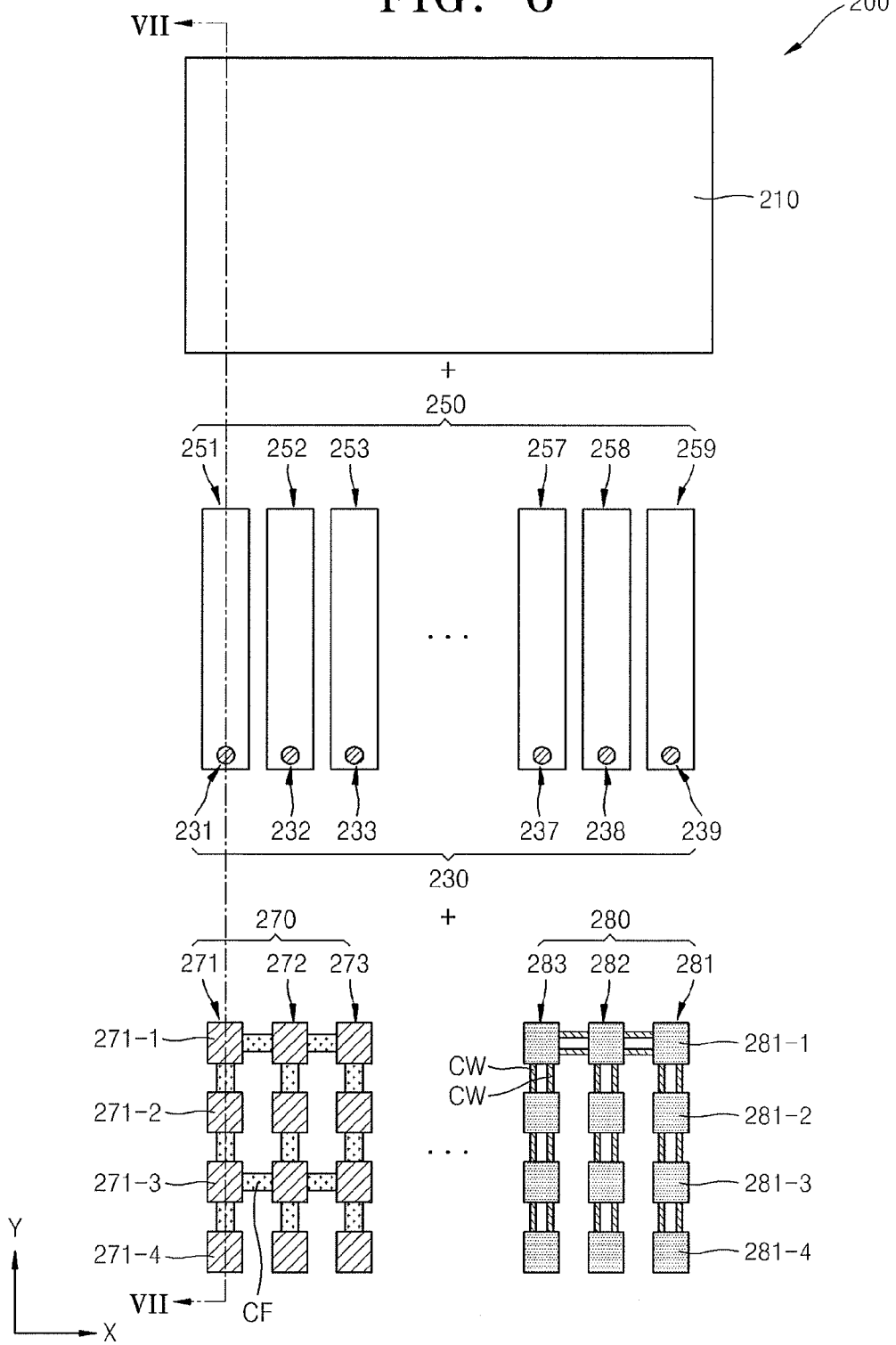
FIG. 6 is a plan view of FIG. 5 as seen from a direction A.
Figure 7:
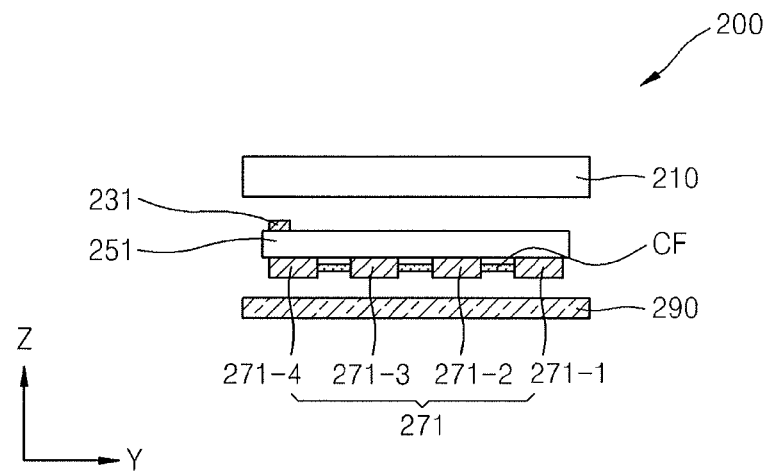
FIG. 7 is a cross-sectional view taken along the line VII-VII of FIG. 6.

FIG. 5 is a cross-sectional view of a display device according to another example embodiment. FIG. 6 is a plan view of FIG. 5 as seen from a direction A. FIG. 7 is a cross-sectional view taken along the line VII-VII of FIG. 6.

In the example embodiment shown in FIGS. 5 to 7, the display device 200 includes a display panel 210, an actuator unit 230, a support unit 250, a circuit unit 270, a battery unit 280, and a back cover 290.

For convenience of description, as shown in FIG. 6, the display panel 210, the actuator unit 230, the support unit 250, the circuit unit 270, and the battery unit 280 are shown on one plane.

The display panel 210 may include various kinds of a display device in order to implement an image that a user recognizes. For example, the display panel 210 may include a display device in an organic light emitting device form including an organic light emitting layer. Since the detailed configuration of the display panel 210 FIG. 5 is the same as that described with reference to FIGS. 4A to 4C, its detailed description is omitted.

The actuator unit 230 is disposed to face one side of the display panel 210. In more detail, the actuator unit 230 faces the bottom of the display panel 210 as shown in FIG. 5. In this case, the display panel 210 may implement an image through the top.

The actuator unit 230 includes a plurality of actuator members 231 to 239. The number of the actuator members 231 to 239 may vary according to a size and type of the display device 200.

The actuator members 231 to 239 generate vibrations and deliver them to the display panel 210. For this, the actuator members 231 to 239 may have, e.g., a vibration motor form.

The actuator members 231 to 239 are uniformly distributed in the entire area of the display panel 210, if possible. For example, as shown in FIG. 5, the actuator members 231 to 239 are disposed at predetermined inverters in a horizontal direction (an X-axis direction of FIG. 5).

Thus, the actuator unit 231 may be disposed to allow only each one of the actuator members 230 and 139 to correspond to a horizontal direction of the display panel 210.

The actuator members 231 to 239 are spaced apart from each other. This helps prevent the vibration of one of the plurality of actuator members 231 to 239 from affecting another actuator member. Thus, each of the actuator members 231 to 239 vibrates independently and delivers the vibration to the display panel 210.

The support unit 250 is formed to support the actuator unit 230. The support unit 250 is disposed to face one side of the display panel 210, i.e., the bottom.

The support unit 250 includes a plurality of support members 251 to 259. The support members 251 to 259 are formed to respectively correspond to the actuator members 231 to 239. In more detail, the support members 251 to 259 respectively contact the actuator members 231 to 239. As shown in FIG. 5, the actuator members 231 to 239 are formed on the tops of the support members 251 to 259, respectively. In this case, the actuator unit 230 contacts the display panel 210. However, the present example embodiment is not limited thereto. Thus, grooves (not shown) having a predetermined depth may be formed in the tops of the support members 251 to 259, and the actuator members 231 to 239 may be disposed in the grooves to allow the display panel 210 to contact the support unit 250. In addition, the actuator members 231 to 239 may be disposed in the support members 251 to 259 to allow the display panel 210 to contact the support unit 250.

The support members 251 to 259 are formed to contact the actuator members 231 to 239 so that they receive vibrations occurring from the actuator members 231 to 239. At this point, the support members 251 to 259 are spaced apart from each other in order to help prevent the vibration delivered to one of the support members 251 to 259 from being spread into at least one of the remaining support members.

Through this, the support members 251 to 259 vibrate respectively by the actuator members 231 to 239 corresponding thereto.

The plurality of support members 251 to 259 are uniformly distributed in the entire area of the display panel 210, if possible. For example, as shown in FIG. 6, each of the support members 251 to 259 may be disposed at a predetermined interval in the horizontal direction (the X-axis direction of FIG. 6) of the display panel 210.

Thus, the support unit 250 may be disposed to allow only each one of the support members 251 and 259 to correspond to a horizontal direction of the display panel 210. Additionally, each of the support members 251 to 259 is formed to have an elongated form. Thus, each of the support members 251 to 259 elongates in a direction intersecting the arrangement direction thereof, i.e., a vertical direction of the display panel 210. For example, each of the support members 251 to 259 may have a length corresponding to the vertical length of the display panel 210.

The circuit unit 270 and the battery unit 280 are disposed to face the support unit 250. Thus, the circuit unit 270 and the battery unit 280 are disposed not to overlap each other and to face the support unit 250.

The circuit unit 270 includes a plurality of circuit members 271 to 273. The number of the circuit members 271 to 273 may vary according to a size and type of the display device 200.

The circuit members 271 to 273 are spaced apart from each other. A circuit connection member CF is disposed to deliver an electrical signal between the circuit members 271 to 273 spaced apart from each other. The circuit connection member CF may have flexibility.

The circuit members 271 to 273 are disposed to respectively correspond to the support members 251 to 253. Additionally, for efficiency, durability, and thickness reduction aspects of the assembly of the display device 200, the circuit members 271 to 273 may closely contact the support members 251 to 253, respectively.

Additionally, the circuit member 271 includes a plurality of split members 271-1 to 271-4 spaced apart from each other. The plurality of split members 271-1 to 271-4 may be disposed spaced apart from each other at predetermined intervals in a direction intersecting the arrangement direction of the plurality of circuit members 271 to 273, i.e., a vertical direction of the display panel 210. The plurality of split members 271-1 to 271-4 are electrically connected to each other by the circuit connection member CF.

Since the configurations of the circuit members 272 and 273 are similar to that of the circuit member 271, their detailed descriptions are omitted.

The battery unit 280 includes a plurality of battery members 281 to 283. The number of the battery members 281 to 283 may vary according to a size and type of the display device 200.

The battery unit 280 supplies a power for driving the display panel 210 or the actuator unit 230. The battery members 281 to 283 are spaced apart from each other. A battery connection member CW is disposed for electrical connection between the battery members 281 to 283 spaced apart from each other. The battery connection member CW may have a conductive wire form.

Additionally, the battery unit 280 may be spaced apart from the circuit unit 270.

The battery members 281 to 283 are disposed to respectively correspond to the support members 257 to 259. Additionally, for efficiency, durability, and thickness reduction aspects of the assembly of the display device 200, the battery members 281 to 283 may closely contact the support members 257 to 259, respectively.

Additionally, the circuit member 281 includes a plurality of split members 281-1 to 281-4 spaced apart from each other. The plurality of split members 281-1 to 281-4 may be disposed spaced apart from each other at predetermined intervals in a direction intersecting the arrangement direction of the plurality of circuit members 281 to 283, i.e., a vertical direction of the display panel 210. The plurality of split members 271-1 to 271-4 are electrically connected to each other by a circuit connection member CW.

Since the configurations of the battery members 282 and 283 are similar to that of the battery member 281, their detailed descriptions are omitted.

The back cover 290 may be disposed to face the display panel 210. The back cover 290 is disposed farther away from the display panel 210, compared to the actuator unit 230, the support unit 250, the circuit unit 270, and the battery unit 280. The back cover 290 protects the actuator unit 230, the support unit 250, the circuit unit 270, and the battery unit 280, and when the display device 200 is implemented for a mobile device, it may maintain its external appearance and provide easy connection for other members.

Moreover, the back cover 290 may be formed of a material for preventing vibration transmission, for example, a rubber material. Through this, the vibration occurring from the actuator unit 230 independently generating vibration may be prevented from being spread and delivered to an entire surface of the back cover 290.

The display device 200 generates a vibration, which a user senses, with the actuator unit 230, to improve user convenience. At this point, the actuator unit 230 includes a plurality of actuator members 231 to 239 spaced apart from each other to generate separated vibrations. Through this, vibration selectively occurs in a specific area of the display device 200, thereby improving user convenience. Additionally, by arranging the support members 251 to 259 spaced apart from each other to correspond to the actuator members 231 to 239, the vibration occurring from one of the actuator members 231 to 239 may be prevented from being spread into an entire area of the display device 200.

Since the circuit unit 270 contacting the support unit 250 includes the plurality of circuit members 271 to 273 spaced apart from each other and the battery unit 280 includes the plurality of battery members 281 to 283 spaced apart from each other, the vibration occurring from one of the actuator members 231 to 239 may be prevented from being spread into an entire area of the display device 200. Through this, vibration occurrence in a specific area of the display device 200 and user detection characteristic may be improved.

Additionally, since the circuit member 271 includes a plurality of split members 271-1 to 271-4 spaced apart from each other, the vibration occurring from one of the actuator members 231 to 239 may be prevented from being spread into an entire area of the circuit unit 270. Additionally, since the battery member 281 includes a plurality of split members 281-1 to 281-4 spaced apart from each other, the vibration occurring from one of the actuator members 231 to 239 may be prevented from being spread into an entire area of the battery unit 280.

According to the present example embodiment, the back cover 290 protects the back of the display device 200 and is formed of a material for preventing vibration transmission such as a rubber material. Thus, the vibration occurring from one of the actuator members 231 to 239 may be prevented from being spread into an entire area of the display device 100.

Additionally, when a substrate (not shown) of the display panel 210 is formed of a flexible material, the bending of the display panel 210 may be easily controlled by separately controlling the actuator members 231 to 239, so that user convenience may be improved.

Figure 8:
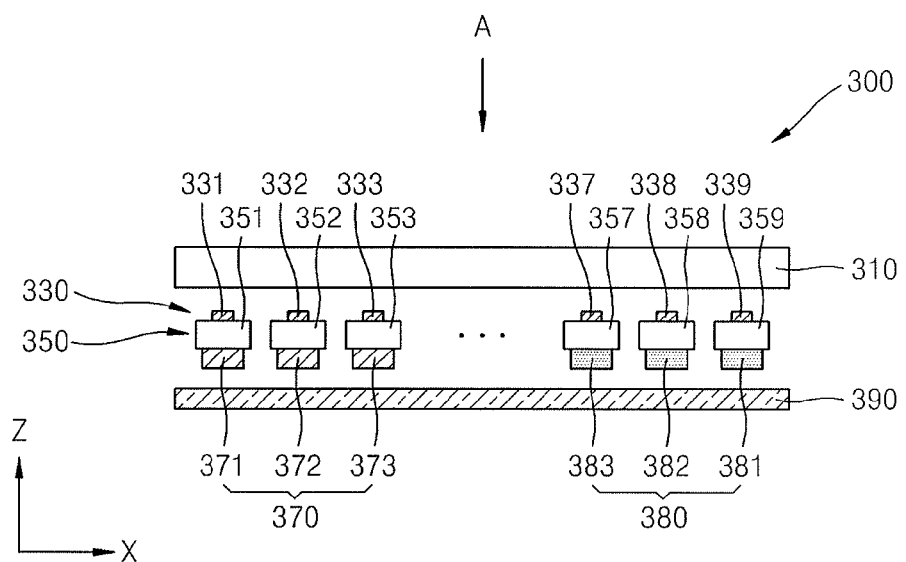
FIG. 8 is a cross-sectional view illustrating a display device according to another example embodiment.
Figure 9:
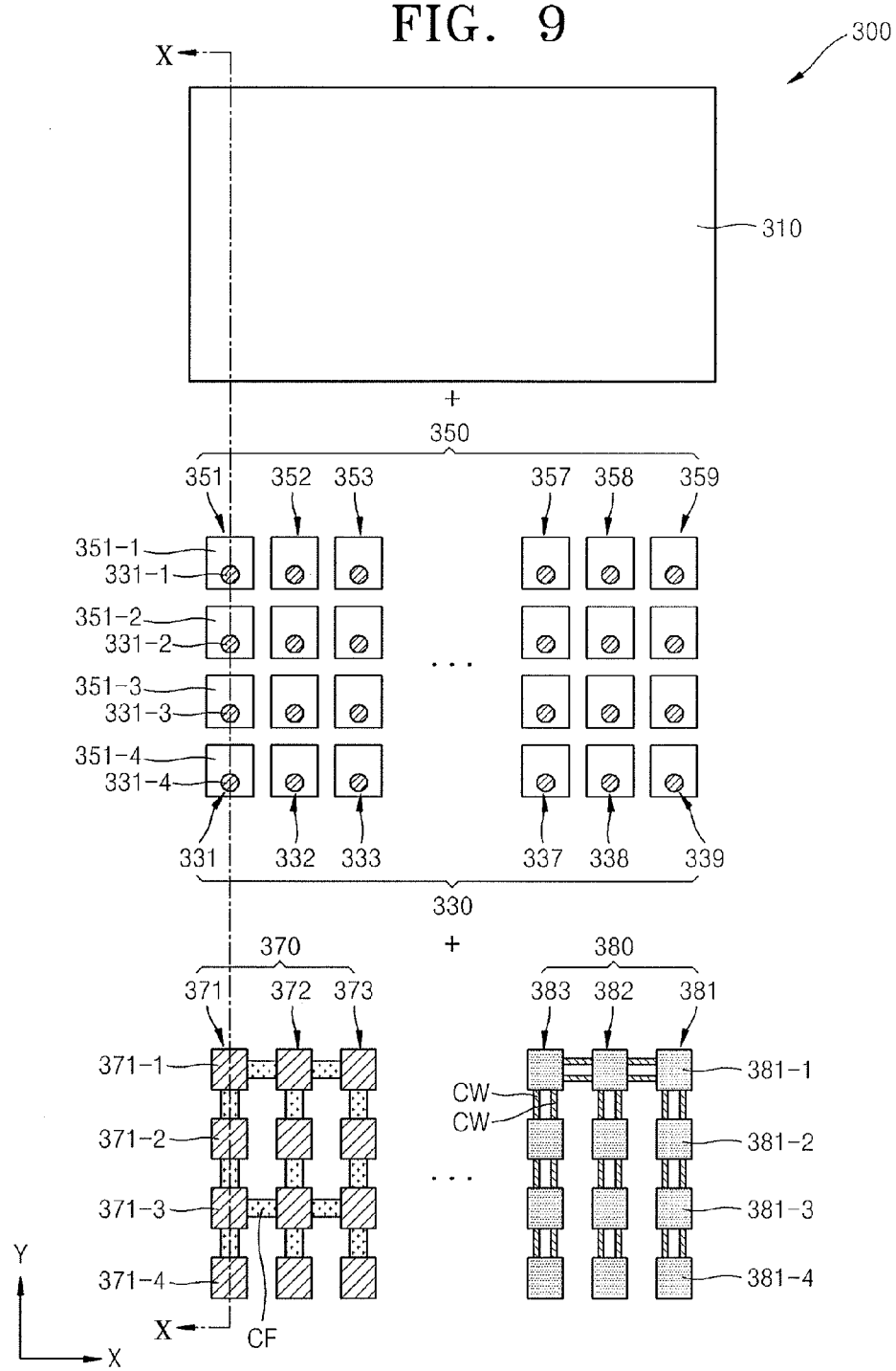
FIG. 9 is a plan view of FIG. 8 as seen from a direction A.
Figure 10:
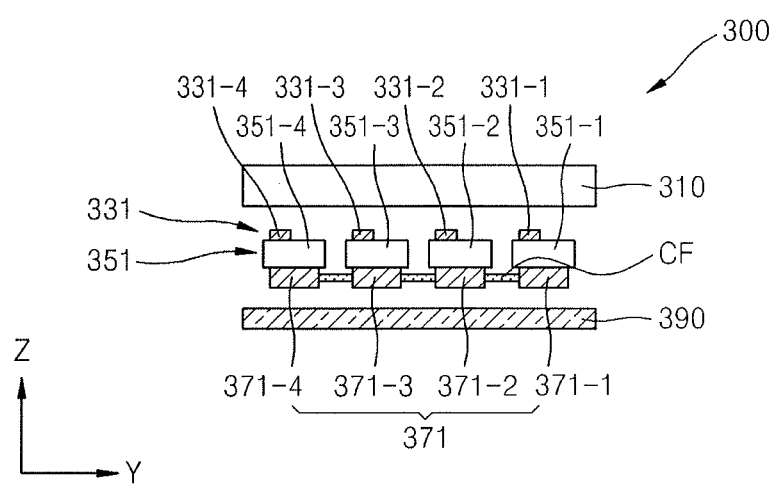
FIG. 10 is a cross-sectional view taken along the line X-X of FIG. 8.

FIG. 8 is a cross-sectional view of a display device according to another example embodiment. FIG. 9 is a plan view of FIG. 8 as seen from a direction A. FIG. 10 is a cross-sectional view taken along the line X-X of FIG. 8.

In the example embodiment shown in FIGS. 8 to 10, the display device 300 includes a display panel 310, an actuator unit 330, a support unit 350, a circuit unit 370, a battery unit 380, and a back cover 390.

For convenience of description, as shown in FIG. 9, the display panel 310, the actuator unit 330, the support unit 350, the circuit unit 370, and the battery unit 380 are shown on one plane.

The display panel 310 may include various kinds of a display device in order to implement an image that a user recognizes.

The actuator unit 330 is disposed to face one side of the display panel 310. In more detail, the actuator unit 330 faces the bottom of the display panel 310 as shown in FIG. 9. In this case, the display panel 310 may implement an image through the top.

The actuator unit 330 includes a plurality of actuator members 331 to 339. The number of the actuator members 331 to 339 may vary according to a size and type of the display device 300.

The actuator members 331 to 339 generate vibrations and deliver them to the display panel 310. For this, the actuator members 331 to 339 may have, e.g., a vibration motor form.

The actuator members 331 to 339 are uniformly distributed in the entire surface of the display panel 310. For example, the actuator members 331 to 339 are disposed at predetermined inverters in a horizontal direction (the X-axis direction of FIG. 8 or 9) of the display panel 310.

Thus, the actuator unit 330 may be disposed to allow only each one of the actuator members 330 and 339 to correspond to a horizontal direction of the display panel 310.

The actuator members 331 to 339 are spaced apart from each other. This helps prevent the vibration of one of the plurality of actuator members 331 to 339 from affecting another actuator member. Thus, each of the actuator members 331 to 339 vibrates independently and delivers the vibration to the display panel 310.

Additionally, the actuator member 331 includes first, second, third, and fourth actuator members 331-1, 331-2, 331-3, and 331-4 spaced apart from each other. The first to fourth actuator members 331-1 to 331-4 are arranged in a vertical direction (the Y-axis direction of FIG. 9) of the display panel 310. Since the actuator member 331 includes the first to fourth actuator members 331-1 to 331-4 spaced apart from each other, it may more easily generate a selective vibration at a desired position with respect to the entire surface of the display panel 310. Since other actuator members 332 to 339 have the same configuration as the actuator member 331, their detailed descriptions are omitted.

The support unit 350 is formed to support the actuator unit 330. The support unit 350 is disposed to face one side of the display panel 310, i.e., the bottom.

The support unit 350 includes a plurality of support members 351 to 359. The support members 351 to 359 are formed to respectively correspond to the actuator members 331 to 339. In more detail, the support members 351 to 359 respectively contact the actuator members 331 to 339. As shown in FIG. 8, the actuator members 331 to 339 are formed on the tops of the support members 351 to 359, respectively. However, the present example embodiment is not limited thereto. Thus, grooves (not shown) having a predetermined depth may be formed in the tops of the support members 351 to 359, and the actuator members 331 to 339 may be disposed in the grooves to allow the display panel 310 to contact the support unit 350. In addition, the actuator members 331 to 339 may be disposed in the support members 351 to 359 to allow the display panel 310 to contact the support unit 350.

The support members 351 to 359 are formed to contact the actuator members 331 to 339 so that they receive vibrations occurring from the actuator members 331 to 339. At this point, the support members 351 to 359 are spaced apart from each other in order to help prevent the vibration delivered to one of the support members 351 to 359 from being spread into at least one of the remaining support members.

Through this, the support members 351 to 359 vibrate respectively by the actuator members 331 to 339 corresponding thereto.

The plurality of support members 351 to 359 are uniformly distributed in the entire area of the display panel 310, if possible. For example, as shown in FIGS. 8 and 9, each of the support members 351 to 359 may be disposed at a predetermined interval in the horizontal direction (the X-axis direction of FIG. 8 or 9) of the display panel 310.

Additionally, the support member 351 may include first to fourth support members 351-1 to 351-4 spaced apart from each other. The first to fourth support members 351-1 to 351-4 are arranged in a vertical direction of the display panel 310. The first to fourth support members 351-1 to 351-4 are formed to correspond to the first to fourth actuator members 331-1 to 331-4, respectively, and are spaced apart from each other. Through this, by helping prevent the vibrations occurring from the first to fourth actuator members 331-1 to 331-4 from affecting each other, the vibrations may be prevented from being spread into the entire area of the support member 351, and also, by helping prevent the vibrations from being spread into the entire area of the support unit 350, the position of vibration occurrence may be controlled more accurately. Since other support members 352 to 359 have the same configuration as the support member 351, their detailed descriptions are omitted.

For example, each of the support members 351 to 359 may be disposed to correspond to the vertical length of the display panel 310. Thus, for example, the first to fourth support members 351-1 to 351-4 have a predetermined length and are disposed at predetermined intervals to correspond to the full width in a vertical direction of the display panel 310.

The circuit unit 370 and the battery unit 380 are disposed to face the support unit 350. Thus, the circuit unit 370 and the battery unit 380 are disposed not to overlap each other and to face the support unit 350.

The circuit unit 370 includes a plurality of circuit members 371 to 373. The number of the circuit members 371 to 373 may vary according to a size and type of the display device 300.

The circuit members 371 to 373 are spaced apart from each other. A circuit connection member CF is disposed to deliver an electrical signal between the circuit members 371 to 373 spaced apart from each other. The circuit members 371 to 373 are disposed to respectively correspond to the support members 351 to 353. Additionally, for efficiency, durability, and thickness reduction aspects of the assembly of the display device 300, the circuit members 371 to 373 may closely contact the support members 351 to 353, respectively.

Additionally, the circuit member 371 may include a plurality of split members 371-1 to 371-4 spaced apart from each other. The plurality of split members 371-1 to 371-4 may be disposed spaced apart from each other at predetermined intervals in a direction intersecting the arrangement direction of the plurality of circuit members 371 to 373, i.e., a vertical direction of the display panel 310. The plurality of split members 371-1 to 371-4 are electrically connected to each other by the circuit connection member CF.

Since the configurations of the circuit members 372 and 373 are similar to that of the circuit member 371, their detailed descriptions are omitted.

The battery unit 380 includes a plurality of battery members 381 to 383. The number of the battery members 381 to 383 may vary according to a size and type of the display device 300.

The battery unit 380 supplies a power for driving the display panel 310 or the actuator unit 330. The battery members 381 to 383 are spaced apart from each other. A battery connection member CW is disposed for electrical connection between the battery members 381 to 383 spaced apart from each other. The battery connection member CW may have a conductive wire form.

Additionally, the battery unit 380 may be spaced apart from the circuit unit 370.

The battery members 381 to 383 are disposed to respectively correspond to the support members 357 to 359. Additionally, for efficiency, durability, and thickness reduction aspects of the assembly of the display device 300, the battery members 381 to 383 may closely contact the support members 357 to 359, respectively.

Additionally, the battery member 381 includes a plurality of split members 381-1 to 381-4 spaced apart from each other. The plurality of split members 381-1 to 381-4 may be disposed spaced apart from each other at predetermined intervals in a direction intersecting the arrangement direction of the plurality of battery members 381 to 383, i.e., a vertical direction of the display panel 310. The plurality of split members 371-1 to 371-4 are electrically connected to each other by the circuit connection member CW.

Since the configurations of the battery members 382 and 383 are similar to that of the battery member 381, their detailed descriptions are omitted.

The back cover 390 may be disposed to face the display panel 310. The back cover 390 is disposed farther away from the display panel 310, compared to the actuator unit 330, the support unit 350, the circuit unit 370, and the battery unit 380. The back cover 390 protects the actuator unit 330, the support unit 350, the circuit unit 370, and the battery unit 380, and when the display device 300 is implemented for a mobile device, it maintains its external appearance and provides easy connection for other members.

Moreover, the back cover 390 may be formed of a material for preventing vibration transmission, for example, a rubber material. Through this, the vibration occurring from the actuator unit 330 independently generating vibration may be prevented from being spread and delivered to an entire surface of the back cover 390.

The display device 300 generates a vibration, which a user senses, with the actuator unit 330, to improve user convenience. At this point, the actuator unit 330 includes a plurality of actuator members 331 to 339 spaced apart from each other to generate separated vibrations. Through this, vibration selectively occurs in a specific area of the display device 300, thereby improving user convenience. Moreover, since the actuator member 331 includes the first to fourth actuator members 331-1 to 331-4 spaced apart from each other, it may more easily generate a selective vibration at a desired position with respect to the entire surface of the display panel 310.

Furthermore, by arranging the support members 351 to 359 spaced apart from each other to correspond to the actuator members 331 to 339, the vibration occurring from one of the actuator members 331 to 339 may be prevented from being spread into an entire area of the display device 300. Since the support member 351 includes the first to fourth support members 351-1 to 351-4 corresponding to the first to fourth actuator members 331-1 to 331-4, the vibration occurring from each of the first to fourth actuator members 331-1 to 331-4 may be prevented from being spread into an entire area of the display device 300.

Figure 12:
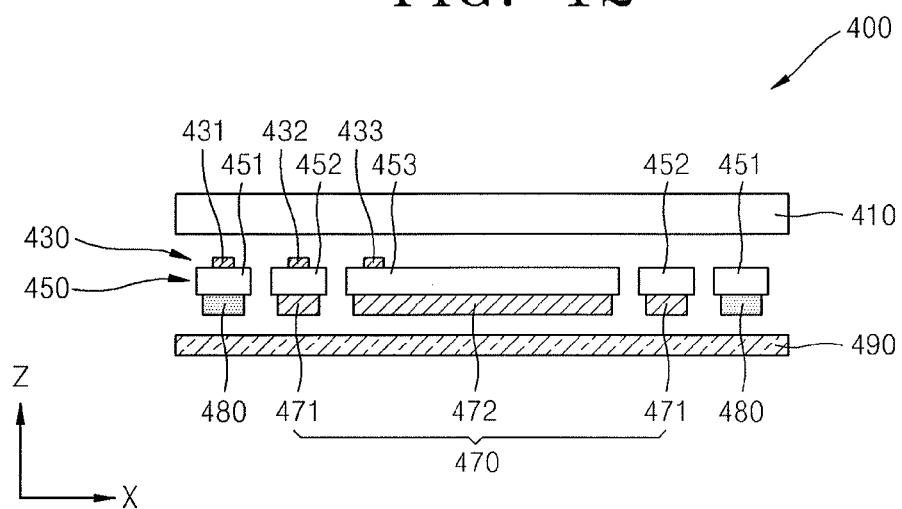
FIG. 12 is a cross-sectional view taken along line XII-XII of FIG. 11.

FIG. 11 is a plan view of a display device according to another example embodiment. FIG. 12 is a cross-sectional view taken along the line XII to XII of FIG. 11.

Referring to FIGS. 11 to 12, the display device 400 includes a display panel 410, an actuator unit 430, a support unit 450, a circuit unit 470, a battery unit 480, and a back cover 490.

For convenience of description, as shown in FIG. 11, the display panel 410, the actuator unit 430, the support unit 450, the circuit unit 470, and the battery unit 480 are shown on one plane.

The display panel 410 may include various kinds of a display device in order to implement an image that a user recognizes.

The actuator unit 430 is disposed to face one side of the display panel 410. In more detail, the actuator unit 430 faces the bottom of the display panel 410 as shown in FIG. 12. In this case, the display panel 410 may implement an image through the top.

The actuator unit 430 includes a plurality of actuator members 431 to 433. The number of the actuator members 431 to 433 may vary according to a size and type of the display device 400.

The actuator members 431 to 433 generate vibrations and deliver them to the display panel 410. For this, the actuator members 431 to 433 may have a vibration motor form.

The actuator members 431 to 433 are spaced apart from each other. Additionally, the actuator members 431 to 433 are disposed not to be along the horizontal and vertical directions of the display panel 410. Through this, the actuator unit 430 may be formed to allow only each one of the actuator members 431 and 439 to correspond to a horizontal or vertical direction of the display panel 410.

The support unit 450 is formed to support the actuator unit 430. The support unit 450 is disposed to face one side of the display panel 410, i.e., the bottom.

The support unit 450 includes a plurality of support members 451 to 453. The support members 451 to 453 are formed to respectively correspond to the actuator members 431 to 433. In more detail, the support members 451 to 453 respectively contact the actuator members 431 to 433.

As shown in FIG. 12, the actuator members 431 to 433 are formed on the tops of the support members 451 to 453, respectively. In this case, the actuator unit 430 contacts the display panel 410. However, the present example embodiment is not limited thereto. Thus, grooves (not shown) having a predetermined depth may be formed in the tops of the support members 451 to 453, and the actuator members 431 to 433 may be disposed in the grooves to allow the display panel 410 to contact the support unit 450. In addition, the actuator members 431 to 433 may be disposed in the support members 451 to 453 to allow the display panel 410 to contact the support unit 450.

The support members 451 to 453 are formed to contact the actuator members 431 to 433 so that they receive vibrations occurring from the actuator members 431 to 433. At this point, the support members 451 to 453 are spaced apart from each other in order to help prevent the vibration delivered to one of the support members 451 to 453 from being delivered to at least one of the remaining support members.

Through this, the support members 451 to 453 vibrate respectively by the actuator members 431 to 433 corresponding thereto.

The plurality of support members 451 to 453 are uniformly distributed in the entire area of the display panel 410, if possible. In more detail, the support member 453 is formed to correspond to the middle of the display panel 410. The support member 452 is formed in a window frame shape to surround the support member 453. The support member 451 is formed in a window frame shape to surround the support member 452. Through this, the support member 452 is formed closer to the middle area of the display panel 410, compared to the support member 451.

The circuit unit 470 and the battery unit 480 are disposed to face the support unit 450. Thus, the circuit unit 470 and the battery unit 480 are disposed not to overlap each other and to face the support unit 450.

The circuit unit 470 includes a plurality of circuit members 471 and 472. The number of the circuit members 471 and 472 may vary according to a size and type of the display device 400.

The circuit unit 470 may include various members generating and delivering various electrical signals necessary for driving the display panel 410. For this, the plurality of circuit members 471 and 472 may have a form of a PCB. The circuit members 471 and 472 are spaced apart from each other. A circuit connection member CF is disposed to deliver an electrical signal between the circuit members 471 and 472 spaced apart from each other. The circuit connection member CF may be flexible, and may include a form of an FPC, for example.

The circuit members 471 and 472 are disposed to respectively correspond to the support members 452 and 453. Additionally, for efficiency, durability, and thickness reduction aspects of the assembly of the display device 400, the circuit members 471 and 472 may closely contact the support members 452 and 453, respectively.

In more detail, the circuit member 471 is disposed to correspond to the support member 452, and the circuit member 472 is disposed to correspond to the support member 453. Additionally, the circuit member 471 is disposed to surround the circuit member 472.

The battery unit 480 supplies a power for driving the display panel 410 or the actuator unit 430. Additionally, the battery unit 480 may be spaced apart from the circuit unit 470.

The battery unit 480 is disposed to correspond to the support member 451. Additionally, for efficiency, durability, and thickness reduction aspects of the assembly of the display device 400, the battery member 480 may closely contact the support member 451. Additionally, the battery unit 480 is disposed to surround the circuit unit 470.

The back cover 490 may be disposed to face the display panel 410. The back cover 490 is disposed farther away from the display panel 410, compared to the actuator unit 430, the support unit 450, the circuit unit 470, and the battery unit 480. The back cover 490 protects the actuator unit 430, the support unit 450, the circuit unit 470, and the battery unit 480, and when the display device 400 is implemented for a mobile device, it maintains its external appearance and provides easy connection for other members.

Moreover, the back cover 490 may be formed of a material for preventing vibration transmission, for example, a rubber material. Through this, the vibration occurring from the actuator unit 430 independently generating vibration may be prevented from being spread and delivered to the entire surface of the back cover 490.

In addition, although not shown, a touch panel (not shown) for recognizing a user touch may be disposed adjacent to the display panel 410. Moreover, in order to realize a touch function without an additional touch panel, an electrode for touch recognition (not shown), may be disposed in the display panel 410, or on the surface thereof.

In relation to the display device 400, the support unit 450 includes a plurality of support members 451 to 453, and the support member 451 is disposed to correspond to the middle of the display panel 410. The support member 452 surrounds the support member 451, and the support member 453 is disposed to surround the support member 452, so that vibration may occur selectively in an area corresponding to the four edges of the display panel 410.

Figure 13:
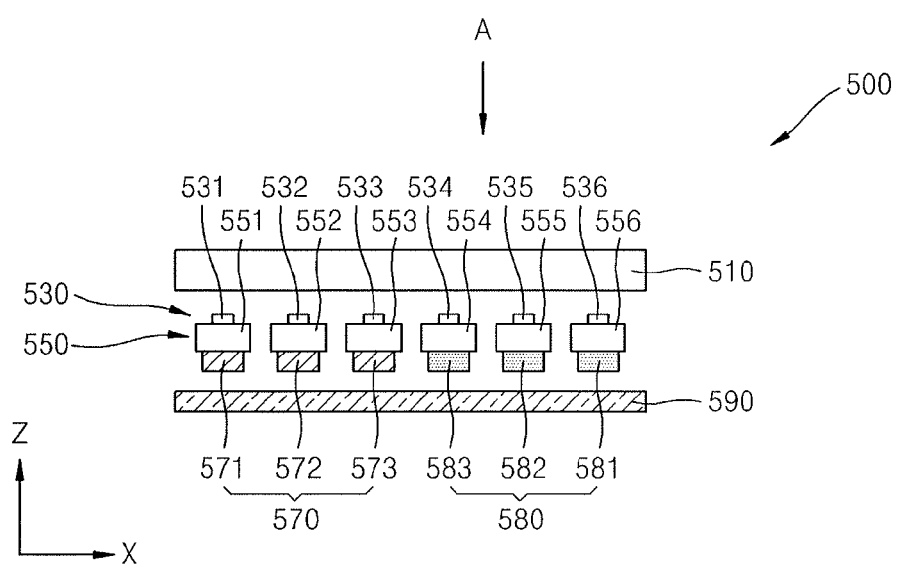
FIG. 13 is a cross-sectional view illustrating a display device according to another example embodiment.

FIG. 13 is a sectional view of a display device according to another example embodiment. FIG. 14 is a plan view seen from a direction A of FIG. 13.

Referring to FIGS. 13 to 14, the display device 500 includes a display panel 510, an actuator unit 530, a support unit 550, a circuit unit 570, a battery unit 580, and a back cover 590.

For convenience of description, as shown in FIG. 14, the display panel 510, the actuator unit 530, the support unit 550, the circuit unit 570, and the battery unit 580 are shown on one plane.

The actuator members 531 to 536 are uniformly distributed in the entire area of the display panel 510. For example, the actuator members 531 to 536 are disposed at predetermined inverters in a vertical direction (the Y-axis direction of FIG. 14) of the display panel 510.

Thus, the actuator unit 531 may be disposed to position only one of the actuator members 530 and 339 in each horizontal direction of the display panel 510.

The support unit 550 is formed to support the actuator unit 530. The support unit 550 is disposed to face one side of the display panel 510, i.e., the bottom.

The support unit 550 includes a plurality of support members 551 to 556. The support members 551 to 556 are formed to respectively correspond to the actuator members 531 to 536.

The support members 551 to 556 may be disposed at predetermined intervals in a vertical direction (the Y-axis direction of FIG. 14) of the display panel 510. Thus, the support unit 551 may be formed to allow only each one of the support members 551 and 556 to correspond to a horizontal direction of the display panel 510. Additionally, each of the support members 551 to 556 is formed to have an elongated form. Thus, each of the support members 551 to 556 elongates in a direction intersecting the arrangement direction thereof, i.e., a horizontal direction of the display panel 510. For example, each of the support members 551 to 556 may have a length corresponding to the horizontal length of the display panel 510.

The circuit unit 570 and the battery unit 580 are disposed to face the support unit 550. Thus, the circuit unit 570 and the battery unit 580 are disposed not to overlap each other and to face the support unit 550.

The circuit unit 570 includes a plurality of circuit members 571 to 573. The circuit members 571 to 573 are spaced apart from each other. A circuit connection member CF is disposed to deliver an electrical signal between the circuit members 571 to 573 spaced apart from each other. The circuit members 571 to 573 are disposed to respectively correspond to the support members 551 to 553. Additionally, the circuit members 571 to 573 may have a form elongating in a horizontal direction of the display panel 510, similar to the support members 551 to 553.

Additionally, for efficiency, durability, and thickness reduction aspects of the assembly of the display device 500, the circuit members 571 to 573 may closely contact the support members 551 to 553, respectively.

The battery unit 580 includes a plurality of battery members 581 to 583. The number of the battery members 581 to 583 may vary according to a size and type of the display device 500. The battery members 581 to 583 are spaced apart from each other. A battery connection member CW is disposed for electrical connection between the battery members 581 to 583 spaced apart from each other. Additionally, the battery unit 580 may be spaced apart from the circuit unit 570.

The battery members 581 to 583 are disposed to respectively correspond to the support members 554 to 556. Additionally, the circuit members 571 to 573 may have a form elongating in a horizontal direction of the display panel 510, similar to the support members 554 to 556.

The back cover 590 may be disposed to face the display panel 510. Unlike the display device 100 of FIG. 1, in relation to the display device 500 of this embodiment, the support unit 550 has a form elongating in a parallel direction of the display panel 510. Through this, the vibration occurrence form of the display device 500 may be diversely defined, and the number of the actuator members 531 to 535 in the actuator unit 530 may be reduced.

By way of summation and review, a display device may include actuators for generating vibration therein for user convenience. In this case, a user may feel vibration according to a user input. In the case of a display device including a user touch function, since vibration occurs according to a user touch, the user may sense the vibration. It may be difficult to dispose an actuator for generating vibration in a display device and control the actuator, which may limit improvements in user convenience.

As described above, embodiments relate to a display device improving user convenience, a mobile device using the same, and a method of manufacturing the display device. Embodiments may provide a display device improving user convenience, a mobile device using the same, and a method of manufacturing the display device.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope as set forth in the following claims.

What is claimed is:

1. A display device, comprising:
   a display panel, the display panel including:
      a substrate;
      a first electrode and a second electrode formed on the substrate; and
      an interlayer disposed between the first electrode and the second electrode, the interlayer including an organic light emitting layer;
   an actuator unit including a plurality of actuator members generating vibrations and disposed to face one side of the display panel; and
   a support unit contacting the actuator unit to receive a vibration generated from the actuator unit, the support unit including a plurality of support members disposed to respectively correspond to the plurality of actuator members and spaced apart from each other.

2. The display device as claimed in claim 1, further comprising a circuit unit formed to correspond to the support unit.

3. The display device as claimed in claim 2, wherein the circuit unit includes a plurality of circuit members corresponding to the plurality of support members and disposed spaced apart from each other.

4. The display device as claimed in claim 3, wherein the plurality of circuit members are electrically connected to each other by a circuit connection member.

5. The display device as claimed in claim 4, wherein the circuit connection member has a flexible printed circuit (FPC) form.

6. The display device as claimed in claim 3, wherein
the plurality of circuit members are disposed in one direction, and
each of the plurality of circuit members includes a plurality of split members spaced apart from each other, disposed in a direction intersecting the one direction, and connected to each other by a circuit connection member.

7. The display device as claimed in claim 2, wherein the circuit unit has a printed circuit board form.

8. The display device as claimed in claim 2, wherein the circuit unit is disposed to contact an opposite side of a side facing the display panel among sides of the support unit.

9. The display device as claimed in claim 1, further comprising a battery unit formed to correspond to the support unit.

10. The display device as claimed in claim 9, wherein the battery unit includes a plurality of battery members corresponding to the plurality of support members and spaced apart from each other.

11. The display device as claimed in claim 10, wherein the plurality of battery members are electrically connected to each other by a battery connection member.

12. The display device as claimed in claim 11, wherein the battery connection member has a conductive wire form.

13. The display device as claimed in claim 10, wherein
the plurality of battery members are disposed in one direction, and
each of the plurality of battery members includes a plurality of split members spaced apart from each other, disposed in a direction intersecting the one direction, and connected to each other by a battery connection member.

14. The display device as claimed in claim 9, wherein the battery unit is disposed to contact an opposite side of a side facing the display panel among sides of the support unit.

15. The display device as claimed in claim 1, further comprising a circuit unit and a battery unit, which are formed to correspond to the support unit and disposed spaced apart from each other.

16. The display device as claimed in claim 15, wherein the circuit unit and the battery unit are disposed not to overlap each other on the basis of a thickness direction of the display panel.

17. The display device as claimed in claim 1, wherein the plurality of support members have a form elongated in parallel with a horizontal or vertical direction of the display panel.

18. The display device as claimed in claim 1, wherein the plurality of support members have a length corresponding to a width in one direction of the display panel.

19. The display device as claimed in claim 1, wherein the support unit is disposed to contact one side of the display panel.

20. The display device as claimed in claim 1, wherein the actuator unit is disposed to contact one side of the display panel.

21. The display device as claimed in claim 1, wherein the actuator unit includes a plurality of actuator members disposed in one direction or a direction intersecting the one direction.

22. The display device as claimed in claim 21, wherein the support member includes a plurality of support members disposed in the one direction or the direction intersecting the one direction.

23. The display device as claimed in claim 1, wherein the plurality of support members of the support unit include one support member formed to correspond to a middle of the display panel and a support member disposed to surround the one support member.

24. The display device as claimed in claim 23, further comprising a circuit unit and a battery unit, which are formed to correspond to the support unit and disposed spaced apart from each other.

25. The display device as claimed in claim 1, further comprising a back cover facing the display panel and disposed farther from the display panel than the support unit and the actuator unit.

26. The display device as claimed in claim 25, wherein the back cover is formed of a vibration transmission blocking material.

27. The display device as claimed in claim 25, wherein the back cover contains rubber.

28. The display device as claimed in claim 1, wherein the substrate has flexibility.

29. The display device as claimed in claim 1, wherein the plurality of actuator members are separately controlled.

30. The display device as claimed in claim 1, further comprising a touch panel disposed adjacent to the display panel.

31. The display device as claimed in claim 1, wherein the display panel includes a touch recognition member thereon or therein to recognize a user touch.

32. A mobile device having a display device, the display device comprising:
a display panel that includes a substrate, a first electrode and a second electrode, and an organic light emitting layer between the first and second electrodes;
an actuator unit including a plurality of actuator members disposed to face one side of the display panel and generating vibrations; and
a support unit contacting the actuator unit to receive a vibration generated from the actuator unit, the support unit including a plurality of support members disposed to respectively correspond to the plurality of actuator members and spaced apart from each other.

33. The mobile device as claimed in claim 32, wherein the mobile device is a mobile phone or a tablet PC.

34. A method of manufacturing a display device, the method comprising:
preparing a display panel that includes a substrate, a first electrode and a second electrode, and an organic light emitting layer between the first and second electrodes;
arranging an actuator unit disposed to face one side of the display panel and including a plurality of actuator members generating vibrations; and
arranging a support unit contacting the actuator unit to receive a vibration generated from the actuator unit, the support unit including a plurality of support members disposed to respectively correspond to the plurality of actuator members and spaced apart from each other.

* * * * *